(12) United States Patent
Li et al.

(10) Patent No.: US 9,975,709 B2
(45) Date of Patent: May 22, 2018

(54) SUBSTRATE TRANSFER APPARATUS AND SYSTEM

(71) Applicants: BOE Technology Group Co., Ltd., Beijing (CN); Hefei Xinsheng Optoelectronics Technology Co., Ltd., Anhui (CN)

(72) Inventors: Feng Li, Beijing (CN); Kai Wang, Beijing (CN)

(73) Assignees: BOE Technology Group Co., Ltd., Beijing (CN); Hefei Xinsheng Optoelectronics Technology Co., Ltd., Hefei (CN)

( * ) Notice: Subject to any disclaimer, the term of this patent is extended or adjusted under 35 U.S.C. 154(b) by 224 days.

(21) Appl. No.: 15/145,392

(22) Filed: May 3, 2016

(65) Prior Publication Data

US 2016/0325947 A1 Nov. 10, 2016

(30) Foreign Application Priority Data

May 8, 2015 (CN) .......................... 2015 1 0236609

(51) Int. Cl.
*B66F 19/00* (2006.01)
*B65G 49/06* (2006.01)
(Continued)

(52) U.S. Cl.
CPC ........ *B65G 49/061* (2013.01); *H01L 21/6734* (2013.01); *H01L 21/67766* (2013.01)

(58) Field of Classification Search
CPC ... B65G 49/061; B65G 49/07; H01L 21/6734; H01L 21/67766; B25J 15/0014; B25J 11/0095
(Continued)

(56) References Cited

U.S. PATENT DOCUMENTS

| 8,465,072 B2 * | 6/2013 | Wu .................... B65G 49/067 294/213 |
| 2014/0265393 A1 * | 9/2014 | Pergande ............. B25J 15/0014 294/81.5 |
| 2014/0265394 A1 * | 9/2014 | Pergande .......... H01L 21/67742 294/81.5 |

FOREIGN PATENT DOCUMENTS

| CN | 1895858 A | 1/2007 |
| CN | 101298143 A | 11/2008 |

(Continued)

OTHER PUBLICATIONS

Jan. 19, 2017—(CN) Second Office Action Appn 201510236609.3 with English Tran.

(Continued)

*Primary Examiner* — Gabriela M Puig
(74) *Attorney, Agent, or Firm* — Banner & Witcoff, Ltd.

(57) ABSTRACT

A substrate transfer apparatus and a substrate transfer system are disclosed. The substrate transfer apparatus including a main body and a plurality of main arms arranged side by side on the main body, wherein a plurality of branch arms are disposed on both sides of each of the main arms, and the plurality of main arms and the plurality of branch arms are disposed in a same supporting plane. When a substrate is transferred, the plurality of main arms and the plurality of branch arms are both disposed beneath the substrate and support the substrate together. Therefore, the downward recess of the substrate due to gravity action can be greatly reduced, so that the flatness of the substrate can be effectively improved, therefore, the display quality of the display product produced can be improved.

20 Claims, 5 Drawing Sheets

(51) Int. Cl.
  *H01L 21/673* (2006.01)
  *H01L 21/677* (2006.01)
(58) Field of Classification Search
  USPC .......................................................... 294/213
  See application file for complete search history.

(56) References Cited

FOREIGN PATENT DOCUMENTS

| | | |
|---|---|---|
| CN | 201882634 U | 6/2011 |
| CN | 203712702 U | 7/2014 |
| JP | 4377918 B2 | 12/2009 |

OTHER PUBLICATIONS

Nov. 1, 2016—(CN) First Office Action Appn 201510236609.3 with English Tran.

* cited by examiner

SUBSTRATE TRANSFER APPARATUS AND SYSTEM

This application claims priority to and the benefit of Chinese Patent Application No. 201510236609.3 filed on May 8, 2015, which application is incorporated herein in its entirety.

TECHNICAL FIELD

At least one embodiment of the present disclosure relates to a substrate transfer apparatus and a substrate transfer system.

BACKGROUND

A liquid crystal display (LCD) panel is generally formed by cell-assembling of an upper substrate and a lower substrate, and liquid crystals are filled between the upper substrate and the lower substrate. The liquid crystals control the intensity of light running through the upper substrate and the lower substrate, and color display is achieved by the color blending of color filters (CFs) of a CF substrate. Therefore, alignment accuracy of the upper substrate and the lower substrate is particularly important.

SUMMARY

At least one embodiment of the present disclosure provides to a substrate transfer apparatus and a substrate transfer system.

At least one embodiment of the present disclosure provides a substrate transfer apparatus comprising a main body and a plurality of main arms arranged side by side on the main body, wherein a plurality of branch arms are disposed on both sides of each of the main arms, and the plurality of main arms and the plurality of branch arms are disposed in a same supporting plane.

At least one embodiment of the present disclosure provides a substrate transfer system comprising any one of the substrate transfer apparatuses provided by at least one embodiment of the present disclosure.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

REFERENCE NUMERALS

100—main body of substrate transfer apparatus; 1—main arm; 2—branch arm; 3—support spacer; 4—working platform; 5—substrate; 9—space capable of accommodating support spacers of working platform between branch arms on inner side of main arm; 10—fork lever.

DETAILED DESCRIPTION

In order to make objects, technical details and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the components or the objects stated before these terms encompass the components or the objects and equivalents thereof listed after these terms, but do not preclude the other components or objects. The phrases "connect", "connected", etc., are not intended to define a physical connection or mechanical connection, but can include an electrical connection, directly or indirectly. "On," "under," "right," "left" and the like are only used to indicate relative position relationship, and when the position of the object which is described is changed, the relative position relationship can be changed accordingly.

Figure 1A:
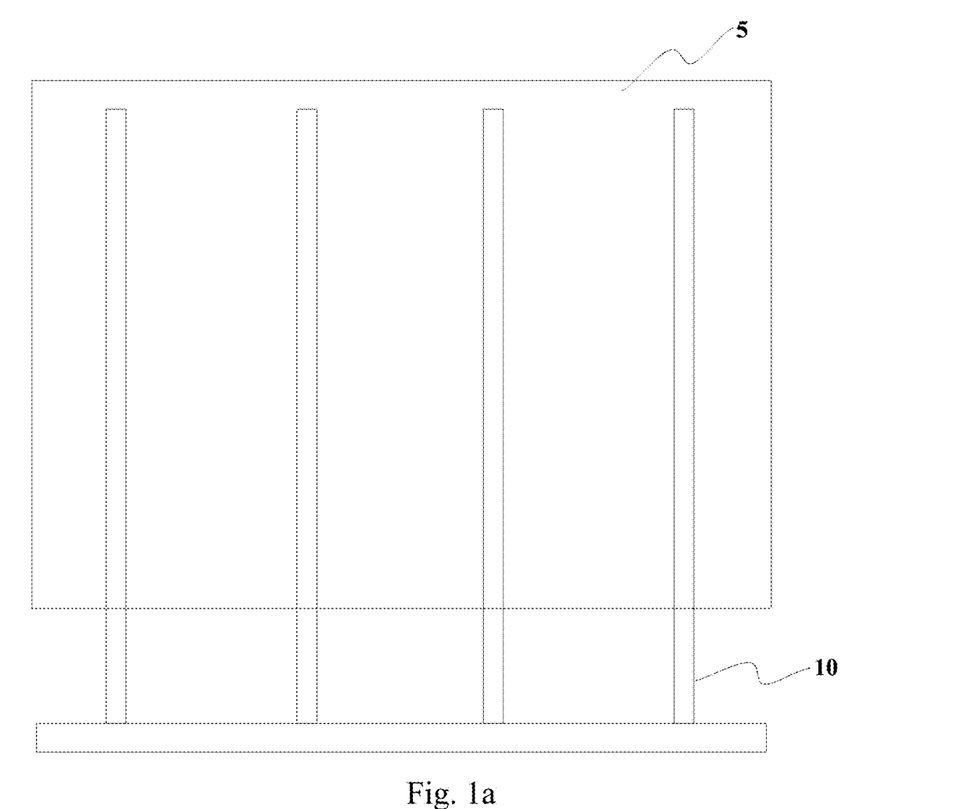
FIG. 1a is a top view of transferring a substrate by a substrate transfer apparatus.
Figure 1B:
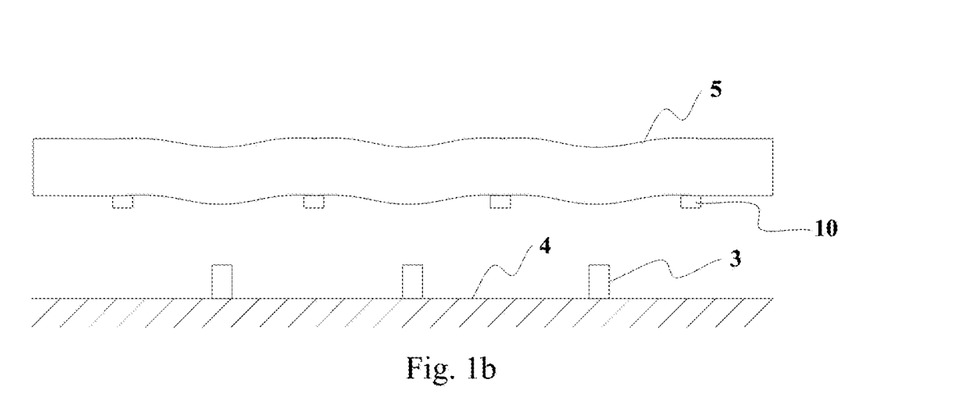
FIG. 1b is a sectional view of transferring a substrate by a substrate transfer apparatus.

Generally, in the process of manufacturing a display panel, after cell-assembly of an upper substrate and a lower substrate, a substrate including the upper substrate and a lower substrate must also be transferred to a sealant photo-curing apparatus for sealant curing. In general, as for substrate transfer, a substrate transfer system provided with a substrate transfer apparatus (e.g., a fork of a robot) is adopted for substrate transfer. As illustrated in FIG. 1a and FIG. 1b, a substrate transfer apparatus includes four fork levers 10 which can be inserted into spaces between support spacers 3 protruding from a working platform 4, so that a substrate 5 can be removed from the support spacers 3 or placed on the support spacers 3.

As illustrated in FIG. 1b, in a process of transferring a substrate 5, portions disposed between adjacent fork levers 10 will be recessed downwards due to gravity action. At this point, as sealant curing has not been completed, relative offset between an upper substrate and a lower substrate will be caused and cannot be quickly restored after the fork levers 10 are removed. After the sealant is cured, the relative offset between the upper substrate and the lower substrate is fixed, so that display products have defects of light leakage, color cast and the like, therefore, the display quality of the products can be severely affected. The technical problem is more obvious particularly when the display product has higher and higher resolution, lower and lower thickness and larger and larger substrate dimension.

In order to effectively maintain flatness of a substrate in a transfer process and improve display quality of a display product, the embodiments of the present disclosure provide a substrate transfer apparatus and a substrate transfer system. When the substrate transfer system provided by the embodiments of the present disclosure is adopted for substrate transfer, the downward recess of a substrate due to gravity action can be reduced, so that the flatness of the substrate can be effectively improved, therefore, display quality of a display product can be improved.

Figure 2A:
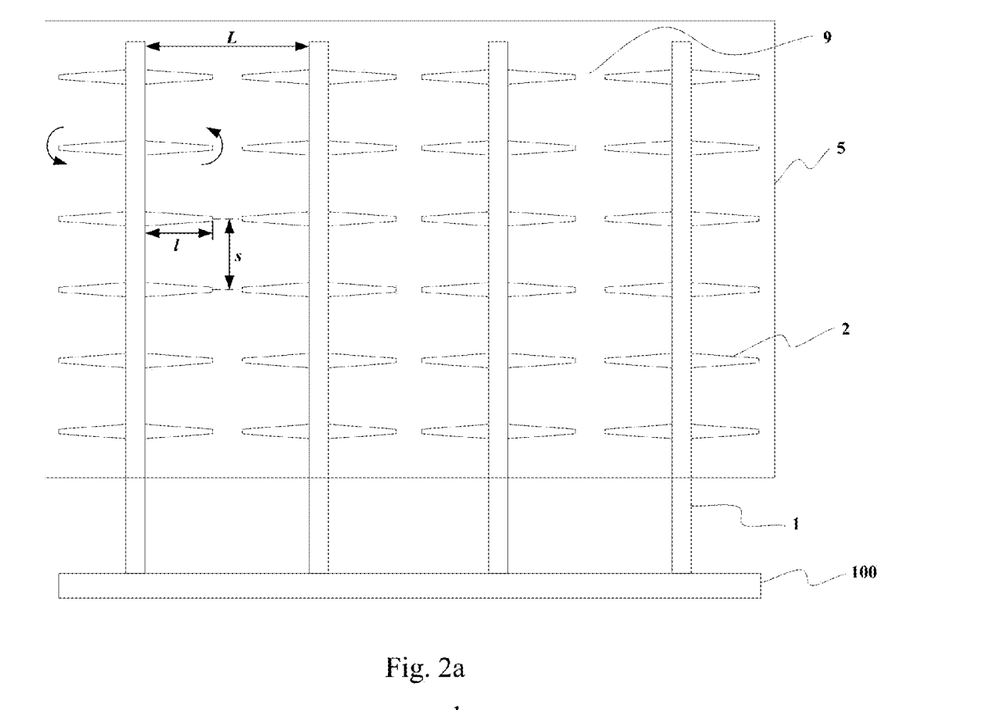
FIG. 2a is a top view of transferring a substrate by a substrate transfer apparatus provided by one embodiment of the present disclosure.
Figure 3:
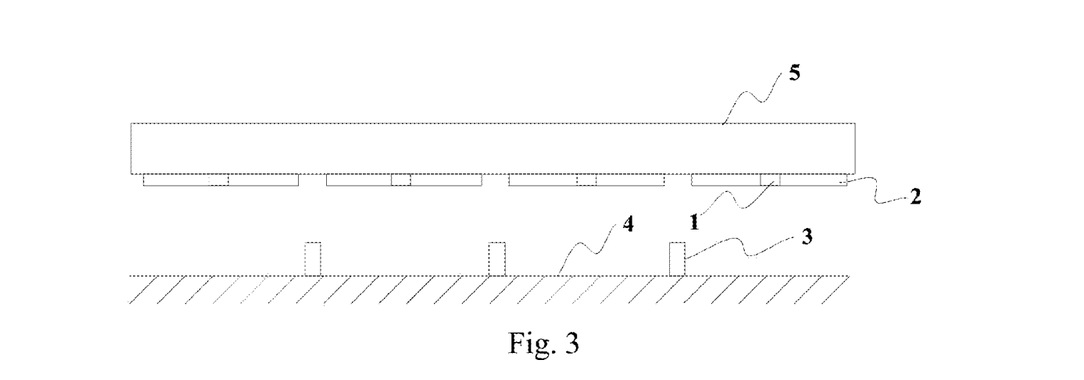
FIG. 3 is a sectional view of transferring a substrate by a substrate transfer apparatus provided by one embodiment of the present disclosure.

As illustrated in FIG. 2a and FIG. 3, one embodiment of the present disclosure provides a substrate transfer apparatus including a main body 100 and a plurality of main arms 1 arranged side by side on the main body 100, a plurality of branch arms 2 are disposed on both sides of each of the main arms 1, the plurality of main arms 1 and the plurality of branch arms 2 are disposed in the same supporting plane.

The substrate transfer apparatus can be used for transferring a substrate before sealant curing. It is worth mentioning that the substrate transfer apparatus can also be used for transferring other process substrates (e.g., array substrates etc.). No limitation is given to the specific application of the substrate transfer apparatus.

When a general substrate transfer apparatus is used in a substrate transfer process, as portions of a substrate between adjacent fork levers are lack of support, the portions of the substrate between the adjacent fork levers will be recessed downwards due to gravity action, therefore, the flatness can be affected. In the substrate transfer apparatus provided by the embodiment, as illustrated in FIG. 3, when a substrate 5 is transferred, the main arms 1 and the branch arms 2 are both disposed beneath the substrate 5 and support the substrate 5 together. Therefore, the downward recess of the substrate 5 due to gravity action can be greatly reduced, so that the flatness of the substrate 5 can be effectively improved, therefore, the display quality of the display product produced can be improved.

For instance, in one example, as illustrated in FIG. 2a, the plurality of branch arms 2 on both sides of each of the main arms 1 are axial symmetrically arranged with respect to the main arm 1 to which the plurality of branch arms belong. Thus, uniform supporting force can be provided for the substrate 5. Therefore, the flatness of the substrate 5 can be improved. Moreover, for instance, each of the branch arms 2 of each of the main arms 1 has a length l equal to a spacing s of two adjacent branch arms 2 disposed on the same side of the main arm 1 to which the branch arms 2 belong. Thus, the supporting structure can be further improved and the number of the branch arms 2 can be reduced on the premise of ensuring uniform supporting force.

For instance, in one example, in order to avoid position interference between branch arms 2 of adjacent main arms 1, a spacing L of two adjacent main arms 1 is greater than a sum of a length l of two longest branch arms 2, belonging to the adjacent main arms respectively, on an inner side of the two adjacent main arms. Moreover, in order to avoid position interference between the branch arms 2 and the support spacers 3 of the working platform 4, the support spacers 3 of the working platform 4 shall be accommodated into the branch arms 2 on the inner side of the two adjacent main arms 1, namely, a space 9 capable of accommodating support spacers of the working platform between the branch arms 2 on the inner side of the two adjacent main arms 1. For instance, in one example, the spacing L of the two adjacent main arms 1 is 56 cm; the lengths l of the branch arms 2 are all 26 cm; and a space of 4 cm is reserved between the inner branch arms 2 of the two adjacent main arms 1 and used for accommodating corresponding support spacer(s) 3.

For instance, in one example, each main arm and its branch arms are relatively fixed, and the branch arms are always in an extending state. For instance, the main arm and its branch arms can be integrally formed, or the branch arms and the main arm to which the branch arms belong can be fixedly connected with each other by bonding, riveting or other means. It should be noted that the fixing means of the main arms and its branch arms is not limited in the present disclosure.

Figure 2B:
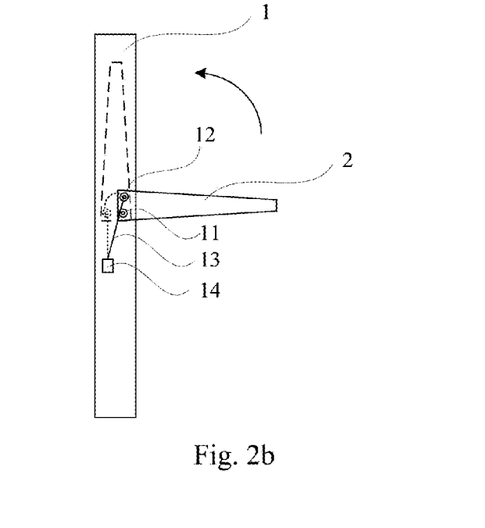
FIG. 2b is a top view of transferring a substrate by a substrate transfer apparatus, in which branch arms are rotatable, provided by one embodiment of the present disclosure.
Figure 2C:
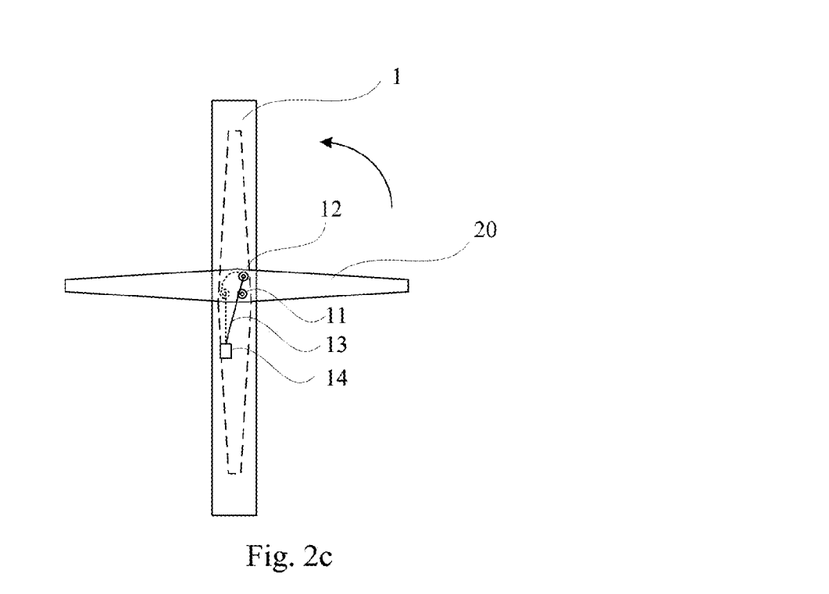
FIG. 2c is a top view of transferring a substrate by a substrate transfer apparatus, in which general branch arms are rotatable, provided by one embodiment of the present disclosure.

In another example, each of the branch arms 2 can be capable of being rotated to extend and retract with respect to the main arm 1 to which the branch arm 2 belongs. For example, "to extend" means to become a state that the branch arm 2 and the main arm 1 to which the branch arm 2 belongs form an included angle in a range of greater than 0 and less than 180 degrees, and "to retract" means to become a state that the branch arm 2 and the main arm 1 to which the branch arm 2 belongs form an included angle of 0 or 180 degrees. As illustrated in FIG. 2b, in one example, each of the branch arm 2 is connected with the main arm 1 to which the branch arm belongs by a fixed shaft 11 and connected with a connecting rod 13 by a connecting shaft 12, and the connecting rod 13 can be connected with a driving member 14. For instance, the branch arm can rotate around the fixed shaft 11 for one circle, so that the branch arm can be capable of being rotated to extend and retract with respect to the main arm 1. For instance, as illustrated in FIG. 2c, in another example, two branch arms (for instance, two branch arms which are opposite to each other and disposed on the main arm in a horizontal direction in FIG. 2a), disposed respectively on both sides of the main arm to which the two branch arms belong, are in an integral structure so as to form a general branch arm 20 which can be capable of being rotated to extend and retract with respect to the main arm 1 to which the general branch arm belongs. That is to say, the two branch arms disposed on both sides of the main arm respectively are in an integral structure so as to form a general branch arm 20. The general branch arm 20 is connected with the main arm 1 to which the general branch arm belongs through a fixed shaft 11 and connected with a connecting rod 13 through a connecting shaft 12, and the connecting rod 13 is connected with a driving member 14. Moreover, for instance, the general branch arm can rotate around the fixed shaft 11 for one circle, so that the general branch arm can be capable of being rotated to extend and retract with respect to the main arm 1. The driving member 14, for instance, can include a hydraulic cylinder, a motor, etc. For instance, the driving member 14 can be disposed on the main arm 1 or the main body 100, which is not limited thereto. For instance, the branch arm 2 can be driven to rotate by the hydraulic cylinder or the motor. It should be noted that FIG. 2b and FIG. 2c only illustrate the rotatable extension and retraction of one branch arm and one general branch arm and other branch arms and general branch arms can be as illustrated in the figures. Moreover, the case that the branch arm 2 can be capable of being rotated to extend and retract with respect to the main arm 1 is not limited to the example as illustrated in FIG. 2*b*.

Figure 4:
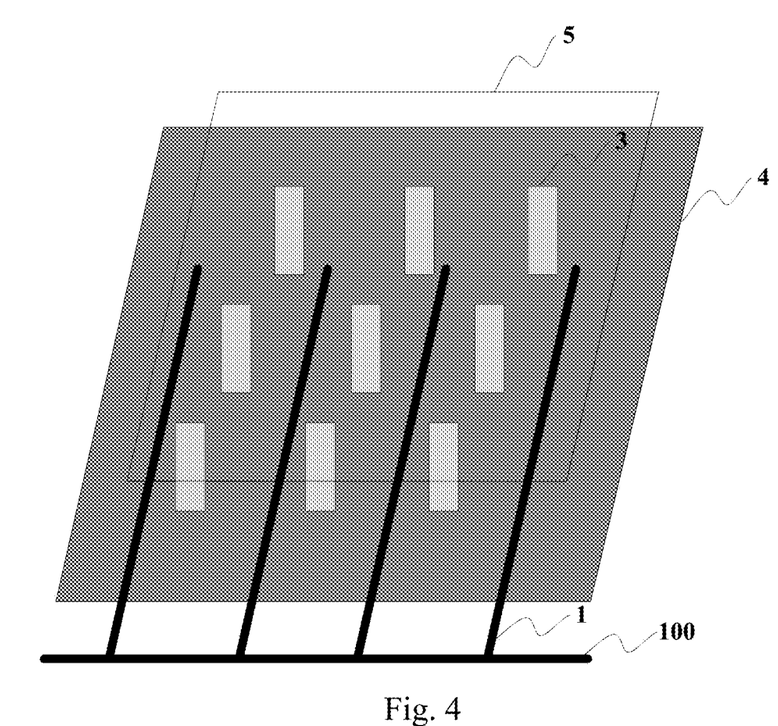
FIG. 4 is a schematic diagram illustrating the case that a substrate transfer apparatus provided by one embodiment of the present disclosure is inserted below a substrate.
Figure 5:
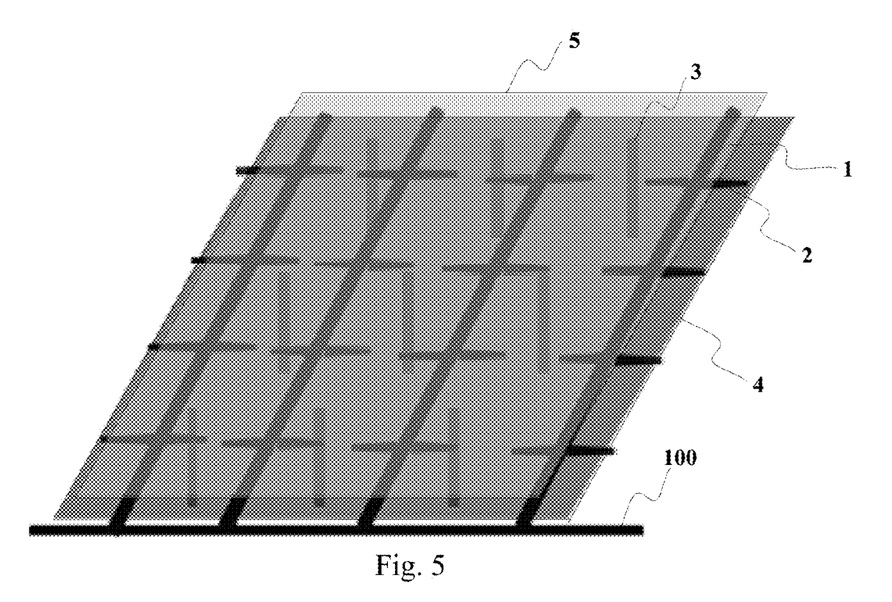
FIG. 5 is a schematic diagram illustrating a substrate support of a substrate transfer apparatus provided by one embodiment of the present disclosure.

For instance, before a substrate transfer apparatus moves to a position below a substrate 5, the branch arms 2 can be in a retracted state, as illustrated in FIG. 4. After the substrate transfer apparatus moves to the position below the substrate 5, the branch arms 2 are rotated to extend, and the main arms 1 and the branch arms 2 support below the substrate 5 together, as illustrated in FIG. 5. At this point, the substrate 5 can be transferred from support spacers 3 of an upstream working platform to support spacers of a downstream working platform. Subsequently, the branch arms 2 are rotated to retract, and the substrate transfer apparatus is removed from a bottom of the substrate 5. By adoption of the design, the movement flexibility of the substrate transfer apparatus can be improved; the moving efficiency can be improved; and the collision between the branch arms and the support spacers 3 can be reduced. In addition, whether the branch arms 2 are required to be rotated to extend can also be determined according to the type of the substrate to be transferred. For instance, when glass substrates with good hardness and small deformation are transferred, the branch arms 2 can be not rotated to extend but be in a retracted state in a transferring process.

Optionally, the branch arms 2 on both sides of the main arm 1, to which the branch arms belong, have a rotating direction of counterclockwise or clockwise upon being rotated to extend, and the branch arms 2 on both sides of the main arm 1, to which the branch arms belong, have a rotating direction of counterclockwise or clockwise upon being rotated to retract. For instance, in one example, as illustrated in FIG. 2*a*, the rotating direction of being rotated to extend of the branch arms 2 on both sides of the main arm 1 to which the branch arms belong is same, namely the branch arm 2 on the left side of the main arm 1 is capable of being rotated clockwise to extend and capable of being rotated counterclockwise to retract and the branch arm 2 on the right side of the main arm 1 is capable of being rotated clockwise to extend and capable of being rotated counterclockwise to retract. Thus, more branch arms 2 can be distributed on both sides of the main arm 1, so that more uniform support can be provided for the substrate.

For instance, in one example, as illustrated in FIG. 2*a*, each of the branch arms 2 can be capable of being rotated to extend until the branch arm is perpendicular to the main arm 1 to which the branch arm belongs, so that the support span can be maximized by fully utilizing the length of the branch arm 2, therefore, better support can be provided for the portions of the substrate 5 located between the two adjacent main arms 1.

It is worth mentioning that the branch arm 2 can also be not perpendicular to the main arm 1 in an extended state but forms a definite included angle with the main arm 1. For instance, an included angle of 45 degrees is formed between the branch arm 2 and the main arm 1. In this case, the downward recess of the substrate due to gravity action can also be effectively reduced. Therefore, the flatness of the substrate can be improved.

For instance, in one example, the main arms 1 and the branch arms 2 are made of stainless steel material and coated with an insulating layer on the outside thereof. In this way, the influence of electrostatic to the substrate can be reduced when the supporting intensity is enough simultaneously, so that the product quality can be improved. The material of the insulating layer is not limited. For instance, an insulating resin layer can be adopted. It should be noted that the material of the main arms 1 and the branch arms 2 is not limited to the materials which are enumerated above.

One embodiment of the present disclosure further provides a substrate transfer system, which includes the substrate transfer apparatus provided by any one of the above-mentioned embodiments. When the substrate transfer system is adopted for substrate transfer, the downward recess of the substrate due to gravity action can be reduced, so that the flatness of the substrate can be effectively improved, therefore, the display quality of the produced display product can be improved.

What are described above is related to the illustrative embodiments of the disclosure only and not limitative to the protecting scope of the present disclosure. The protecting scopes of the present disclosure are defined by the accompanying claims.

This application claims the benefit of priority from Chinese patent application No. 201510236609.3, filed on May 8, 2015, the disclosure of which is incorporated herein in its entirety by reference as a part of the present application.

What is claimed is:

1. A substrate transfer apparatus comprising a main body and a plurality of main arms arranged side by side on the main body, wherein a plurality of branch arms are disposed on both sides of each of the main arms, and the plurality of main arms and the plurality of branch arms are disposed in a same supporting plane,
    each of the branch arms is capable of being rotated to extend and retract with respect to the main arm to which the branch arm belongs,
    each of the branch arms is connected with the main arm to which the branch arm belongs by a fixed shaft, the branch arm is connected with a connecting rod by a connecting shaft, the connecting rod is connected with a driving member.

2. The substrate transfer apparatus according to claim 1, wherein the plurality of branch arms on both sides of each of the main arms are axial symmetrically arranged with respect to the main arm to which the plurality of branch arms belong.

3. The substrate transfer apparatus according to claim 1, wherein each of the branch arms of each of the main arms has a length equal to a spacing of two adjacent branch arms disposed on a same side of the main arm to which the branch arms belong.

4. The substrate transfer apparatus according to claim 1, wherein a spacing of two adjacent main arms is greater than a sum of a length of two longest branch arms, belonging to the adjacent main arms respectively, on an inner side of the two adjacent main arms.

5. The substrate transfer apparatus according to claim 1, wherein a space capable of accommodating support spacers of a working platform is provided between the branch arms on an inner side of two adjacent main arms.

6. The substrate transfer apparatus according to claim 1, wherein each of the branch arms is capable of being rotated to extend to be perpendicular to the main arm to which the branch arm belongs.

7. The substrate transfer apparatus according to claim 1, wherein the branch arms disposed on both sides of the main arm have a rotating direction of counterclockwise or clockwise upon being rotated to extend.

8. The substrate transfer apparatus according to claim 1, wherein the branch arms disposed on both sides of the main arm have a rotating direction of counterclockwise or clockwise upon being rotated to retract.

9. The substrate transfer apparatus according to claim 1, wherein the main arms and the branch arms are made of stainless steel material and coated with an insulating layer on the outside thereof.

10. The substrate transfer apparatus according to claim 9, wherein the insulating layer comprises an insulating resin layer.

11. A substrate transfer system comprising the substrate transfer apparatus according to claim 1.

12. A substrate transfer apparatus comprising a main body and a plurality of main arms arranged side by side on the main body, wherein a plurality of branch arms are disposed on both sides of each of the main arms, and the plurality of main arms and the plurality of branch arms are disposed in a same supporting plane,
  each of the branch arms is capable of being rotated to extend and retract with respect to the main arm to which the branch arm belongs
  wherein two branch arms, disposed respectively on both sides of the main arm to which the two branch arms belong, are in an integral structure to form a general branch arm, the general branch arm is connected with the main arm to which the general branch arm belongs by a fixed shaft, the general branch arm is connected with a connecting rod by a connecting shaft, the connecting rod is connected with a driving member.

13. The substrate transfer apparatus according to claim 12, wherein each of the branch arms is capable of being rotated to extend to be perpendicular to the main arm to which the branch arm belongs.

14. The substrate transfer apparatus according to claim 12, wherein the branch arms disposed on both sides of the main arm have a rotating direction of counterclockwise or clockwise upon being rotated to extend.

15. The substrate transfer apparatus according to claim 12, wherein the branch arms disposed on both sides of the main arm have a rotating direction of counterclockwise or clockwise upon being rotated to retract.

16. The substrate transfer apparatus according to claim 12, wherein the plurality of branch arms on both sides of each of the main arms are axial symmetrically arranged with respect to the main arm to which the plurality of branch arms belong.

17. The substrate transfer apparatus according to claim 12, wherein each of the branch arms of each of the main arms has a length equal to a spacing of two adjacent branch arms disposed on a same side of the main arm to which the branch arms belong.

18. The substrate transfer apparatus according to claim 12, wherein a spacing of two adjacent main arms is greater than a sum of a length of two longest branch arms, belonging to the adjacent main arms respectively, on an inner side of the two adjacent main arms.

19. The substrate transfer apparatus according to claim 12, wherein a space capable of accommodating support spacers of a working platform is provided between the branch arms on an inner side of two adjacent main arms.

20. The substrate transfer apparatus according to claim 12, wherein the main arms and the branch arms are made of stainless steel material and coated with an insulating layer on the outside thereof.

* * * * *